US012707567B1

(12) United States Patent
Simula et al.

(10) Patent No.: US 12,707,567 B1
(45) Date of Patent: Aug. 11, 2026

(54) ELECTRONIC STRUCTURE AND A METHOD OF MANUFACTURING SUCH

(71) Applicant: TactoTek Oy, Oulunsalo (FI)

(72) Inventors: Tomi Simula, Oulunsalo (FI); Tero Rajaniemi, Oulunsalo (FI); Tuomas Nieminen, Oulunsalo (FI); Samuli Yrjänä, Oulunsalo (FI); Ilpo Hänninen, Oulunsalo (FI); Mikko Sippari, Oulunsalo (FI); Mikko Heikkinen, Oulunsalo (FI); Jarkko Torvinen, Oulunsalo (FI); Pasi Raappana, Oulunsalo (FI)

(73) Assignee: Tacto Tek Oy, Oulunsalo (FI)

( * ) Notice: Subject to any disclaimer, the term of this patent is extended or adjusted under 35 U.S.C. 154(b) by 0 days.

(21) Appl. No.: 19/426,727

(22) Filed: Dec. 19, 2025

(51) Int. Cl.
*H05K 1/14* (2006.01)
*H05K 3/36* (2006.01)

(52) U.S. Cl.
CPC ............. *H05K 1/142* (2013.01); *H05K 3/368* (2013.01); *H05K 2201/0129* (2013.01); *H05K 2201/1034* (2013.01); *H05K 2201/10977* (2013.01)

(58) Field of Classification Search
CPC ........ H05K 1/142; H05K 1/141; H05K 3/368; H05K 3/381; H05K 2201/0129; H05K 2201/1034; H05K 2201/10977
USPC ........ 174/250, 251, 254, 255, 256, 261, 260
See application file for complete search history.

(56) References Cited

U.S. PATENT DOCUMENTS 8,093,502 B2 * 1/2012 Mikado ................ H05K 1/0281 29/829
10,013,033 B2 * 7/2018 Dean ...................... H05K 1/142
10,057,989 B1 * 8/2018 Heikkinen ........... H05K 1/0284
11,315,804 B2 * 4/2022 Nomura ................. H05K 1/144
11,425,836 B2 * 8/2022 Kranz .................. H05K 1/0233
12,120,856 B2 * 10/2024 Nguyen ................. H05K 1/141

* cited by examiner

*Primary Examiner* — Angel R Estrada
(74) *Attorney, Agent, or Firm* — Robert P. Michal, Esq.; Rimon PC

(57) ABSTRACT

An electronic structure includes a plurality of subassemblies, wherein each subassembly includes a circuit design and or is configured to host at least one electrically functional element, wherein in at least one of the subassemblies at least one of the functional elements of the structure is a connector element, each subassembly being mechanically and electrically coupled to at least one other subassembly via at least one coupling element, wherein the subassemblies and coupling elements are modular entities joined together to establish the electronic structure, further wherein at least a portion of the electronic structure includes at least one molded plastic layer, the molded plastic layer being provided to at least partially embed, surround, or host coupling elements, preferably each coupling element, the molded plastic layer further being provided to at least partially embed, surround, or host subassemblies, preferably each subassembly.

20 Claims, 5 Drawing Sheets

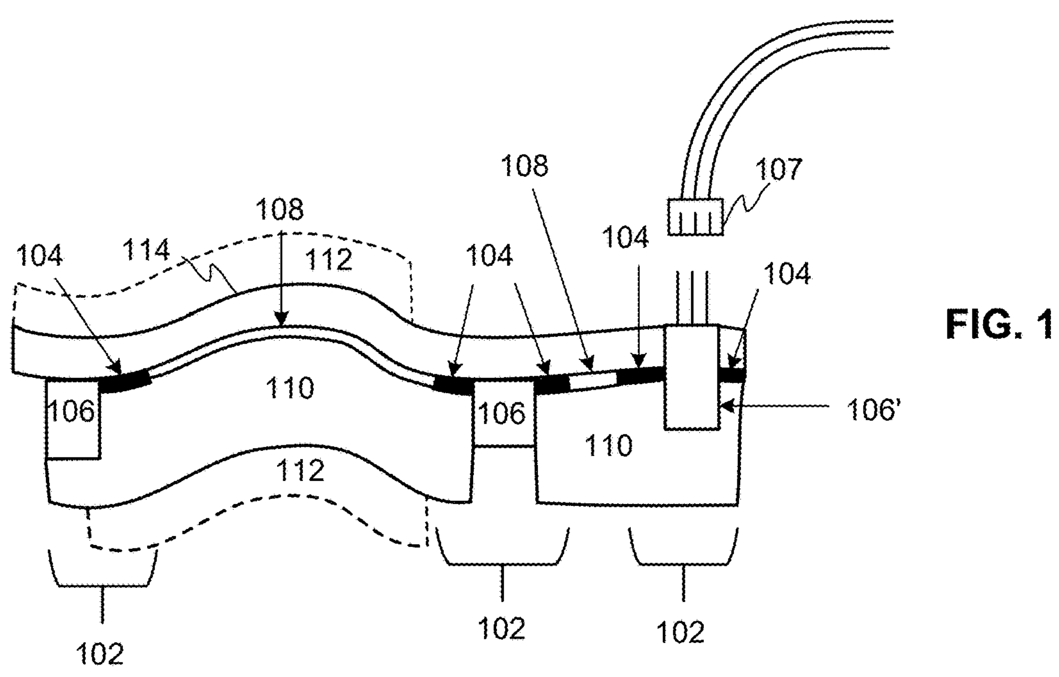
FIG. 1
104
114
108
112
104
108
107
104
104
110
106
106
110
106'
112
102
102
102
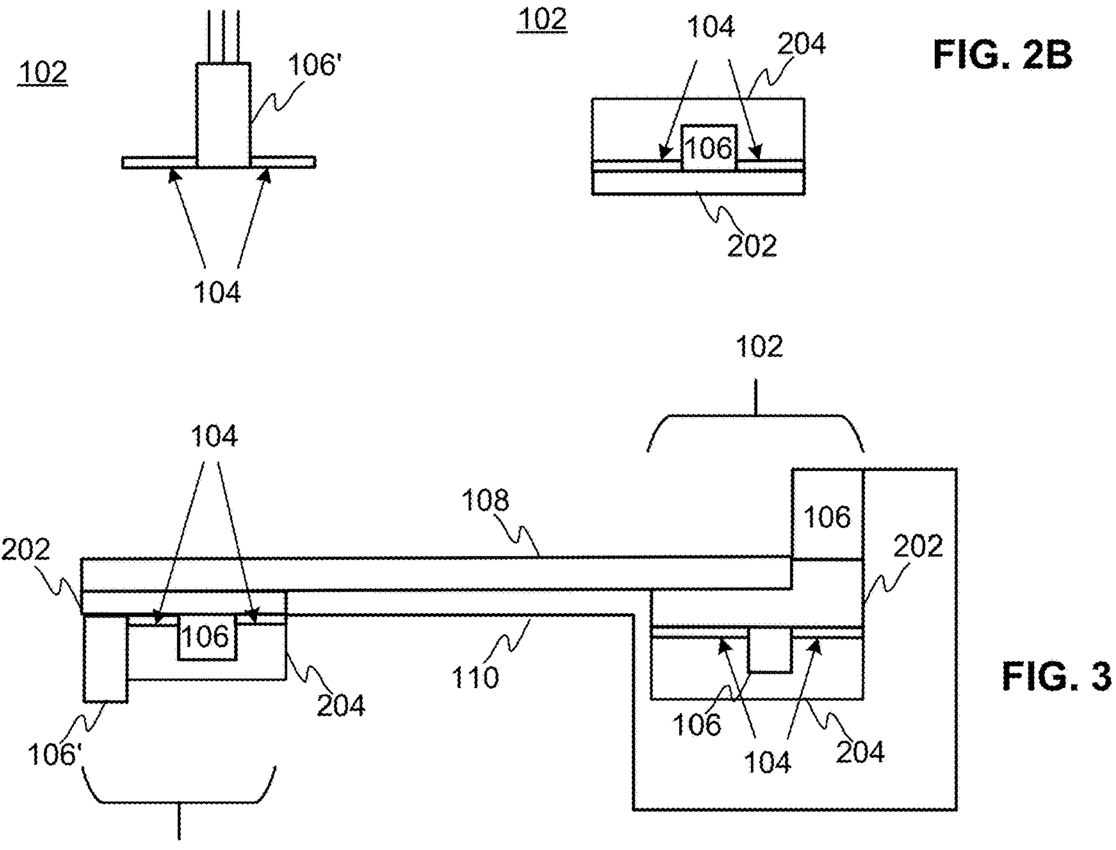
FIG. 2A
102
106'
104
102
104
204
106
202
FIG. 2B
102
104
108
202
106
106
202
110
204
106'
104
106
104
204
FIG. 3
102

ELECTRONIC STRUCTURE AND A METHOD OF MANUFACTURING SUCH

FIELD OF THE INVENTION

The present invention relates in general to electronic structures incorporating functional features such as electronic elements. In particular, the present invention relates to an electronic structure comprising a plurality of subassemblies, where each subassembly is mechanically and electrically coupled to at least one other subassembly via at least one coupling element, wherein at least a portion of the electronic structure comprises at least one molded plastic layer, said molded plastic layer being provided to at least partially embed, surround, or host coupling elements, preferably each coupling element, the molded plastic layer further being provided to at least partially embed, surround, or host subassemblies, preferably each subassembly.

BACKGROUND

Typically, electronic assemblies comprise printed wiring boards that are electrically connected to electronic components and mechanically attached to separate optical and mechanical assemblies manufactured by molding. Such arrangements restrict the degree of structural and functional integration of the electronics into molded structure.

The manufacturing process of molded structure requires being able to process the entire structure at once, which may limit for example the size of the end product. Associated machinery for handling large structures may be expensive. Furthermore, processing large structures may be cumbersome and/or unreliable with the known methods. Manufacturing challenges such as substrate film stretching and issues with positional repeatability may cause production process variation and/or difficulties.

In producing large structures, loose wires in molding may require complicated placement systems that may have to be customized for each design, or alternatively manual labor between molding shots, which may be both expensive and complex.

The end product is usually also a monolithic structure, e.g. with considerable thickness of total assembly at all locations of the structure. This may limit the applications where the structure may be used, such as integration with external structures that comprise varying shapes.

SUMMARY

The objective of the present invention is to at least alleviate one or more of the drawbacks associated with the known solutions. The objective may be achieved with various embodiments of an electronic structure and related methods of manufacturing an electronic structure.

According to a first aspect, an electronic structure is provided, the electronic structure comprising a plurality of subassemblies, wherein each subassembly comprises a circuit design and comprises or is configured to host at least one electrically functional element, wherein in at least one of the subassemblies at least one of the functional elements of the structure is a connector element, each subassembly being mechanically and electrically coupled to at least one other subassembly via at least one coupling element, wherein the subassemblies and coupling elements are modular entities joined together to establish the electronic structure, further wherein at least a portion of the electronic structure comprises at least one molded plastic layer, said molded plastic layer being provided to at least partially embed, surround, or host the coupling elements, preferably each coupling element, the molded plastic layer further being provided to at least partially embed, surround, or host the subassemblies, preferably each subassembly.

With the present invention, an electronic structure comprising a plurality of subassemblies may be provided, where the subassemblies are electrically and mechanically coupled to each other in a reliable manner. Each subassembly may be provided as a discrete entity with associated functional elements, possibly with discrete functionality, while the electronic structure as a whole may be configured to be integrated with an external entity.

Through the invention, even large electronic structures may be provided, which are easier to handle and for example to integrate with external entities, as each subassembly is provided as a modular entity.

The portions of the structure at which the coupling elements are provided may for example be more flexible than the subassemblies. The structure may then be easier to integrate for example with an external entity that has a certain three-dimensional shape.

The structure of the invention may be easier and/or more economical to manufacture than an electronic structure of the prior art. For example, the smaller subassemblies may be easier and more affordable to produce separately beforehand than producing a large electronic structure in one run.

There are currently no practical, proven ways to connect sub-assemblies within a larger overmolded structure. The present invention thus describes methods of achieving interconnections between smaller, much more easily and affordably produced subassemblies, enabling making even very large overmolded electronic structures in an economically feasible way.

The molded plastic layer may be a continuous layer. Here, the molded plastic layer may embed the coupling elements and may further embed at least a portion of the subassemblies entirely, such that functional elements of the subassemblies are embedded by the molded plastic layer.

The molded plastic layer may alternatively be a discontinuous layer comprising regions of discontinuity between subassemblies. In such a case, the molded plastic layer may be provided primarily for embedding, surrounding, or hosting the coupling elements separately and to effectively couple the subassemblies together.

The molded plastic layer may be provided onto a first and/or second side of the electronic structure. In one embodiment, the molded plastic layer is provided on the same side of the structure as the functional element(s). In other embodiments, the molded plastic layer may be provided onto an opposite side of the electronic structure as the functional element(s).

The electronic structure may comprise a further molded plastic layer. The further molded plastic layer may be provided on top of the molded plastic layer. The further molded plastic layer may be provided onto a continuous or discontinuous molded plastic layer. In a case where the molded plastic layer is a discontinuous plastic layer that does not embed, for example, functional element(s) of subassemblies, the further molded plastic layer may be provided to at least partially embed or surround the subassemblies and functional elements thereof.

The electronic structure may comprise a host substrate accommodating the subassemblies and the coupling elements, said host substrate optionally comprising material selected from the group of polymer, thermoplastic material, electrically insulating material, Polymethyl methacrylate (PMMA), Poly Carbonate (PC), copolyester, polyimide, a copolymer of Methyl Methacrylate and Styrene (MS resin), glass, Polyethylene Terephthalate (PET), carbon fiber, organic material, biomaterial, recycled material, leather, wood, textile, fabric, metal, organic natural material, solid wood, veneer, plywood, bark, tree bark, birch bark, cork, natural leather, natural textile or fabric material, naturally grown material, cotton, wool, linen, silk, and any combination of the above.

At least a portion of the subassemblies may each comprise a substrate accommodating the functional element, optionally a substrate film, wherein the substrate is optionally formed, such as into a three-dimensional shape, preferably through high pressure forming. In embodiments where a host substrate is provided, also a host substrate may be formed, e.g. through high pressure forming. A substrate of a subassembly may in other embodiments comprise e.g. a lead frame, circuit board, circuit carrier.

The coupling elements may comprise metal or metal particle conductors.

The molded plastic layer may comprise thermoplastic material, optionally injection molded material.

The coupling elements may comprise material that is different from a material of the subassemblies to which the coupling elements are coupled. The coupling element and subassemblies may thus be differing in nature. At least one material of a coupling element may be different from at least one material of a subassembly, while in some embodiments, a material used in a part of a subassembly may be a material that is also utilized in a coupling element.

The coupling elements may comprise at least one of: conductive wiring, the conductive wiring optionally being coiled conductive wiring and/or coated conductive wiring, flexible printed circuit carrier, elastomeric printed circuit carrier, printed connector conductive adhesive, printed conductor, conductive adhesive, or adhesive metal foil or combinations thereof.

A largest dimension of the electronic structure may be over 30 cm, optionally over 200 cm, such as 30-400 cm or over 400 cm.

A method of manufacturing an electronic structure is also provided according to one aspect of the invention, the method comprising

- obtaining a plurality of subassemblies, wherein each subassembly is provided with a circuit design and comprises or is configured to host at least one electrically functional element, wherein in at least one of the subassemblies at least one of the functional elements of the structure is a connector element,
- providing a plurality of coupling elements to mechanically and electrically couple each subassembly to at least one other subassembly, wherein the subassemblies and coupling elements are modular entities joined together to establish the electronic structure,
- molding a plastic material layer onto at least a portion of the electronic structure to at least partially embed, surround, or host coupling elements, preferably each coupling element, the molded plastic layer further being provided to at least partially embed, surround, or host subassemblies, preferably each subassembly.

The method may comprise providing the subassemblies as comprising a substrate film onto which the at least one functional element is provided. The subassemblies may be provided to further comprise a plastic layer molded to at least partly embed or surround the at least one functional element. The subassemblies with substrate film and functional element may each be overmolded with plastic material before assembly of the electronic structure.

The method may comprise providing the subassemblies and coupling elements on a host substate, the method optionally comprising forming the host substrate.

The method may comprise providing the coupling elements by printing conductive material, optionally by printing conductive material onto a flexible printed circuit board or elastomeric connector, or by printing conductive material onto a host substrate accommodating the subassemblies and coupling elements.

In some embodiments, the method may comprise

- providing a mold tool comprising a main body and a plurality of alignment components, said alignment components and/or main body comprising attachment features for releasably attaching the alignment components to the main body at selected locations, and
- providing selected locations of the partially formed electronic structure upon the alignment components before molding, preferably providing at least some of the subassemblies onto alignment components,
- placing the electronic structure in the vicinity of the main body of the mold tool, and allowing the attachment features to attach the alignment components to the main body, thereby aligning the selected locations of the electronic structure with selected locations of the mold tool.

In some embodiments of the invention, a molding intermediate is therefore used, onto which e.g. flat wires (with functional elements such as pre-mounted connector elements) be provided prior to the intermediates being inserted into a molding tool.

The method may enable low-cost manufacturing of injection molded or resin cast structures with integrated electrical connectors such as wiring and electronics. A part of the structure that will be overmolded may serve as a wire harness, whereby major expensive and time-consuming production steps can be eliminated, reducing cost and assembly complexity.

The need for vacuum inserts during molding may be eliminated. The alignment components may, however, also be provided with vacuum channels in some cases.

While it is possible to directly overmold e.g. wires with reinforced resins, placing the wires in the molding tool and ensuring that they stay in place can be almost as time-consuming as producing a wire harness, and this process may also be difficult, if not impossible, to automate.

The attachment features may comprise magnets, and the alignment components may comprise magnetic material or electromagnetic elements.

The alignment components may comprise retention features, such as pins, for attaching the alignment components to the electronic structure.

The exemplary embodiments of the present invention presented herein are not to be interpreted to pose limitations to the applicability of the appended claims. The verb "to comprise" is used herein as an open limitation that does not exclude the existence of also un-recited features. The features recited in various embodiments and e.g. dependent claims are mutually freely combinable unless otherwise explicitly stated.

The novel features which are considered as characteristic of the present invention are set forth in particular in the appended claims. The present invention itself, however, both as to its construction and its method of operation, together with additional objectives and advantages thereof, will be best understood from the following description of specific embodiments when read in connection with the accompanying drawings.

BRIEF DESCRIPTION OF FIGURES

Some embodiments of the invention are illustrated by way of example in the figures of the accompanying drawings.

FIG. 1 shows a cross-sectional view of an electronic structure.

FIG. 2A illustrates a cross-sectional view of an exemplary subassembly.

FIG. 2B illustrates a cross-sectional view of an exemplary subassembly.

FIG. 3 illustrates a cross-sectional view of an electronic structure.

DETAILED DESCRIPTION OF SOME EMBODIMENTS

Figure 4:
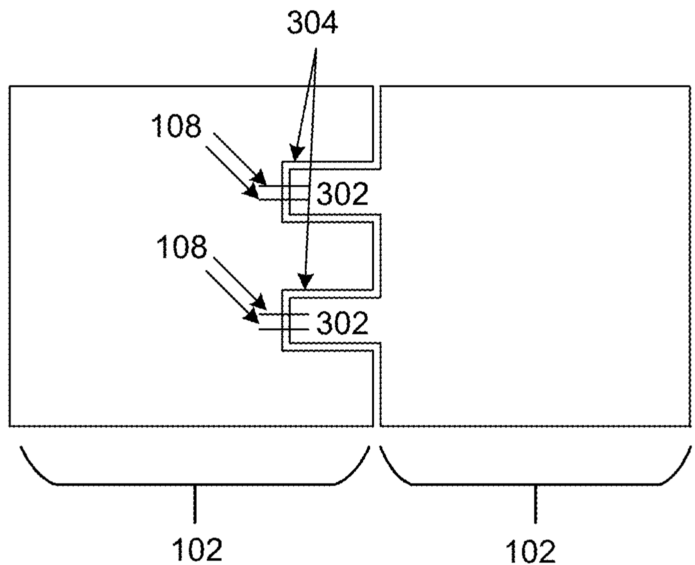
FIG. 4 shows a top view of an electronic structure.

FIG. 1 schematically illustrates an electronic structure according to an embodiment of the invention. The electronic structure comprises a plurality of subassemblies 102, in which each subassembly 102 comprises a circuit design 104 and comprises or is configured to host at least one electrically functional element 106. In at least one of the subassemblies 102, at least one of the functional elements of the structure is a connector element 106'.

The circuit design 104 refers to a circuit design in the form of electrical, optionally additively produced such as screen printed or otherwise printed, conductors such as traces and/or contact pads, which are coupled to functional elements 106 and/or 106'.

A material of elements used in the circuit design, such as of conductors and/or connection/contact elements, such as pads, may comprise at least one material selected from the group consisting of: conductive ink, conductive nanoparticle ink, copper, steel, iron, tin, aluminum, silver, gold, platinum, conductive adhesive, carbon fiber, alloy, silver alloy, zinc, brass, titanium, solder, and any component thereof. The used conductive materials may be optically opaque, translucent and/or transparent at desired wavelengths, such as visible light, so as to mask or let the radiation such as visible light to be reflected therefrom, absorbed therein or let through, for instance.

The connector element 106' may be provided for coupling the electronic structure to an external entity. The connector element 106' may be e.g. a pin connector, blade connector, bayonet connector, fibre optic connector, optical connector, printed interconnects, or board to board connector, for example. An external connecting element 107 is depicted in FIG. 1.

Further functional elements 106 utilized in an electronic structure as functional elements provided in the subassemblies 102 may comprise for example an electrode, electronic component, electromechanical component, electro-optical or optoelectronic component, radiation-emitting component, light-emitting component, such as LED (light-emitting diode), OLED (organic LED), bottom-shooting LED or other light source, radiation detecting component, light-detecting component, photodiode, phototransistor, photovoltaic device, sensor, micromechanical component, switch, touch switch, proximity switch, touch sensor, proximity sensor, capacitive switch, capacitive sensor, projected capacitive sensor or switch, single-electrode capacitive switch or sensor, multi-electrode capacitive switch or sensor, self-capacitance sensor, mutual capacitive sensor, inductive sensor, sensor electrode, UI element, user input element, vibration element, communication element, data processing element, data storage element, or electronic sub-assembly, resistor, capacitor, connector, integrated circuit or electrical, optical or mechanical sub-system, IMSE SiP, or any combination thereof.

Each subassembly 102 is mechanically and electrically coupled to at least one other subassembly 102 via at least one coupling element 108.

The coupling elements 108 may comprise metal or metal particle conductors.

The coupling elements 108 may comprise at least one of: conductive wiring, the conductive wiring optionally being coiled conductive wiring and/or coated conductive wiring, flexible printed circuit carrier, elastomeric printed circuit carrier, printed conductor, conductive adhesive, or adhesive metal foil or combinations thereof.

The coupling element 108 may comprise material that is different from a material of the subassemblies 102 to which the coupling elements are coupled. At least one material of a coupling element may be different from at least one material of a subassembly 102. For example, a coupling element 108 may comprise metal, while a subassembly may comprise for example plastic. The coupling elements 108 may thus enable connections between subassemblies 102 with materials that are mechanically distinct (i.e. non-continuous, e.g. with a substrate that may be provided).

Coupling may be established through materials that are dissimilar with a provided substrate (which will be introduced further below): for instance, flex PCB analogs may be provided on any substrate, bundles of insulated wires may be utilized, as well as wires bound together with tie bars into flat elements, or curled-up spring-like wires that may withstand Coefficient of Thermal Expansion (CTE) mismatch forces.

A distance between any of the subassemblies 102 may be long (up to meters, such as between 10 cm and 10 m) or short (essentially zero or where the subassemblies are shaped to interleave with each other, such as tiles "clipping" to adjacent tile(s), or a distance of e.g. between 1 mm and 10 cm). The distance may vary depending on the use case.

The subassemblies 102 and coupling elements 108 are modular entities joined together to establish the electronic structure, meaning that coupling elements 108 may be discrete elements, provided originally as physically separate entities from the subassemblies 102 before coupling of the subassemblies 102.

The coupling elements 108 may enable power and data transmission between subassemblies 102.

The subassemblies 102 may have distinct functionality. Connections between functional elements 106 may also have functionality, and may comprise e.g. heater wires.

At least a portion of the electronic structure comprises at least one molded plastic layer 110, where the molded plastic layer 110 is provided to at least partially embed, surround, or host coupling elements 108 and subassemblies 102.

The molded plastic layer 110 may comprise thermoplastic material, optionally injection molded material, such as at least one material selected from the group consisting of: elastomeric resin, thermoset material, thermoplastic material, PC, PMMA, ABS, PET, copolyester, copolyester resin, nylon (PA, polyamide), PP (polypropylene), TPU (thermoplastic polyurethane), polystyrene (GPPS), TPSiV (thermoplastic silicone vulcanizate), and MS resin. Thickness of the molded plastic layer 110 may vary depending on the embodiment, e.g. being less than one, one, few or tens of millimeters. The molded plastic layer 110 may at least partially comprise transparent or translucent material.

The molded plastic layer 110 or any further molded plastic layer may be an injection molded plastic layer.

The coupling elements 108 may be either completely overmolded, i.e. embedded in the molded plastic layer 110, or they may reside on the surface of the molded plastic layer 110.

After provision of the molded plastic layer 110, the subassemblies may be essentially inseparably bonded to each other.

In some embodiments, the electronic structure may be a large backplane onto which further elements can be mounted (on connector elements 106', optionally securing with screws) connecting power and data, or the electronic structure may be a smaller entity, such as a multi-letter emblem where the letters are manufactured separately, clipped together and backmolded to obtain a stable, sealed final entity.

The molded plastic layer 110 may be provided as a discontinuous layer, in which for example only the coupling elements 108 (at least partially) and each subassembly 102 (at least partially) is overmolded, where other portions of the electronic structure are left without molded plastic layer 110.

A discontinuous molded plastic layer 110 may be provided in one mold shot. Alternatively, at least a portion of the subassemblies may be provided with a dedicated molded plastic layer before coupling of the subassemblies together with the coupling elements 108.

The molded plastic layer 110 may alternatively be provided as a continuous layer, optionally using one mold shot.

In some embodiments at least one optional further molded plastic layer 112 may be provided, optionally at least partially on top of the molded plastic layer 110. The material of a further molded plastic layer 112 may be the same as the material of the molded plastic layer 110 or the layers could comprise different material. In general, a material of the further molded plastic layer 112 may comprise thermoplastic material, optionally injection molded material, such as at least one material selected from the group consisting of: elastomeric resin, thermoset material, thermoplastic material, PC, PMMA, ABS, PET, copolyester, copolyester resin, nylon (PA, polyamide), PP (polypropylene), TPU (thermoplastic polyurethane), polystyrene (GPPS), TPSiV (thermoplastic silicone vulcanizate), and MS resin.

FIG. 1 further shows an optional host substrate 114 onto which the subassemblies 102 and coupling element(s) 108 may be provided. The host substrate 114 could be formed into a selected three-dimensional shape.

The electronic structure may be utilized in e.g. bumper assemblies for vehicles. The electronic structure may enable provision of e.g. lights behind a possibly painted surface, where sensor connections may be embedded in the bumper assembly.

Further embodiments of the electronic structure may be used in connection with vehicle body parts. The electronic structure may be integrated into an entire front or back assembly of a car, for example, or just corners or a dashboard body as further examples, provided with embedded coupling elements. The electronic structure may employ printed structures in use cases where this is preferred or optimal, while traditional metal structures may be used upon need.

In one example, the electronic structure may be employed in e.g. unmanned aerial, terrestrial or marine vehicles or robotics. The vehicle body and appendages may carry power and motor control signals while e.g. lights and antennas may be provided as functional features in the electronic structure, which may be embedded in the molded plastic material.

Further use cases include e.g. larger medical and scientific devices. The invention may enable coupling elements in connection arms with no need to route the power and/or control signals through e.g. tubes or other hollow structures.

FIGS. 2A and 2B show cross-sectional views of exemplary subassemblies 102. FIG. 2A shows a subassembly comprising a circuit design 104 and connector element 106'.

FIG. 2B shows a subassembly comprising a circuit design and a functional element 106 provided on a substrate 202, the subassembly further comprising a dedicated molded plastic layer 204.

The circuit design 104 and functional element(s) 106, 106' may be provided to a first side and/or second side of the substrates 202 of the subassemblies 102.

A thickness of the substrate(s) 202 may vary depending on the embodiment; it may only be of few tens or hundredths of a millimeter, or considerably thicker, in the magnitude of one or few millimeter(s), for example.

The substrate may comprise thermoformable material, such as polymer, PMMA (Polymethyl methacrylate), Poly Carbonate (PC), copolyester, copolyester resin, polyimide, a copolymer of Methyl Methacrylate and Styrene (MS resin), glass, and/or Polyethylene Terephthalate (PET) or substrate can be substantially rigid such as metal laminate.

The substrate(s) 202 of the subassemblies 102 may be formed into a selected three-dimensional shape.

A material of the dedicated molded plastic layer 204 of subassemblies 102 could comprise polymer material, optionally injection molded material, such as at least one material selected from the group consisting of: elastomeric resin, thermoset material, thermoplastic material, PC, PMMA, ABS, PET, copolyester, copolyester resin, nylon (PA, polyamide), PP (polypropylene), TPU (thermoplastic polyurethane), polystyrene (GPPS), TPSiV (thermoplastic silicone vulcanizate), and MS resin or any combination thereof.

An electronic structure could comprise a varying number of different types of subassemblies 102. The subassemblies may comprise any number of functional elements 106, while at least one subassembly comprises a connector element 106' as functional element.

FIG. 3 shows a further example of an electronic structure. In FIG. 3, subassemblies 102 (or at least one of them) are depicted as being provided with a substrate 202, e.g. substrate film, with circuit design 104 provided thereto, along with functional elements 106, 106.

The subassemblies 102 (or at least a portion of them) are further depicted as being provided with a dedicated molded plastic layer 204. The subassemblies may be provided before coupling element(s).

In the embodiment of FIG. 3, the molded plastic layer 110 is provided to at least partially embed or host coupling element(s) 108 and at least a portion of at least some of the subassemblies 102. The molded plastic layer 110 could be provided onto the first side of the electronic structure. In this case, the subassemblies could comprise the dedicated molded plastic layers 204 and/or the molded plastic layer 110 could also at least partially embed at least some of the functional elements 106, 106' of the subassemblies 102.

The above discussed embodiments relating to FIG. 3 could also comprise a further molded plastic layer(s) 112 provided on either side of the electronic structure.

The electronic structure of FIG. 3 could further comprise a host substrate 114.

FIG. 4 illustrates a top view of an embodiment of an electronic structure. Here, the subassemblies are shaped to comprise complementary interlocking features. The interlocking features may be realized through providing the perimeter of at least one of the subassemblies 102 as comprising protruding portions 302 and providing at least one of the subassemblies 102 as comprising complementary recess portions 304 to receive the protruding portions 302.

The embodiment of FIG. 4 depicts the coupling elements 108 which may e.g. be mating connectors or contact pins. The molded plastic layer 110 (not depicted) could be provided to embed, surround, or host at least the coupling elements 108. In some embodiments, protruding portions can have dual functionality and act also as a coupling element 108 or at least a portion thereof.

It may be noted that the coupling elements 108 may be dedicated coupling elements of a subassembly (such as pins) which are joined to dedicated coupling elements 108 of another subassembly. Alternatively or additionally, a coupling element 108 may be a shared coupling element of subassemblies 102. Coupling elements 108 could be at least partially integrated with the material of the subassembly 102 and at least partially established through e.g. a shape of the subassembly.

The elements of subassemblies 102 shown in the FIG. 4 and comprising the protruding portions 302 and complementary recess portions 304 may be substrates 202 of the subassemblies 102.

Figure 5:
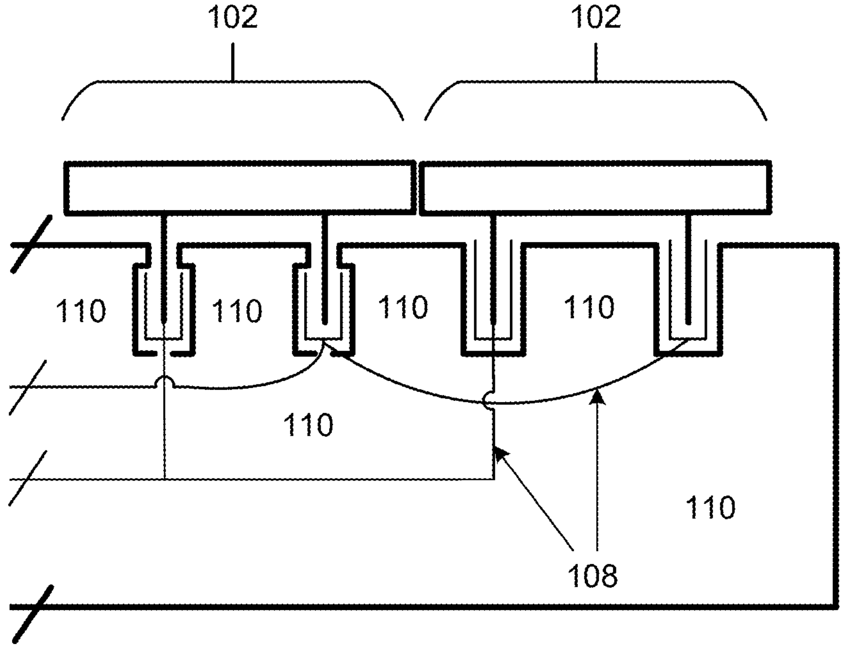
FIG. 5 illustrates a cross-sectional view of an electronic structure.

FIG. 5 illustrates a cross-sectional view of an electronic structure. The solution of FIG. 5 may enable interlocking of subassemblies 102, here via providing subassemblies as being shaped (e.g. with protrusion portions) to conform with counterpart shapes of a support portion, realized in FIG. 5 through the molded plastic layer 110.

Borders between different subassemblies 102 may be faded through the interlocking design.

Interconnections between subassemblies may be realized through coupling element 108 which may be e.g. metal connectors.

The subassemblies of FIG. 5 may be identical in some cases. The solution may provide daisy-chaining subassemblies as tiles provided on a "superstructure" embodied by the molded plastic layer 110.

The embodiments of FIGS. 4 and 5, for example, may allow providing interlocking subassemblies 102 for e.g. substrate-to-substrate or part-to-part connectivity to achieve a modular, scalable, and extendable system architecture.

Figure 6:
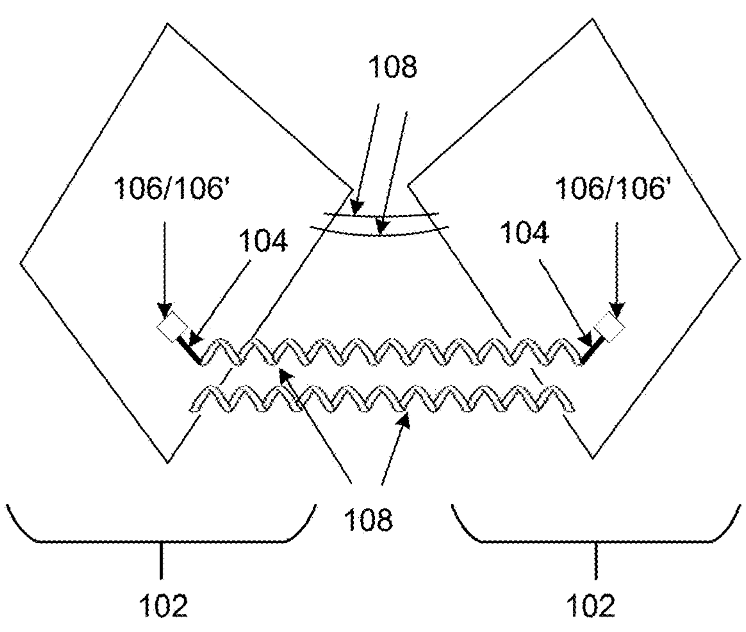
FIG. 6 shows a top view of an electronic structure.

FIG. 6 shows a top view of an electronic structure. The subassemblies 102 may be coupled through coupling elements 108 which may be metal wires. The coupling elements 108 may be coupled to e.g. a substrate film 202 of a subassembly 102 by e.g. crimping, secured with adhesive, they may be tied into holes of substrate film 202, or sewn to the substrate 202. The coupling elements 108 may be essentially straight wires or they may be wound into coils to provide additional dimensional flexibility. The coupling elements 108 may additionally be insulated with a polymer coating to provide electrical insulation, which may reduce placement accuracy requirements. The coupling elements 108 may be locked into place upon provision of a molded plastic layer 110 (not depicted), which may embed the coupling elements 108. The subassemblies 102 of FIG. 5 could comprise features as described elsewhere herein, including circuit design 104 and any number of functional elements 106, 106' and possible dedicated molded plastic layer 204.

Figure 7A:
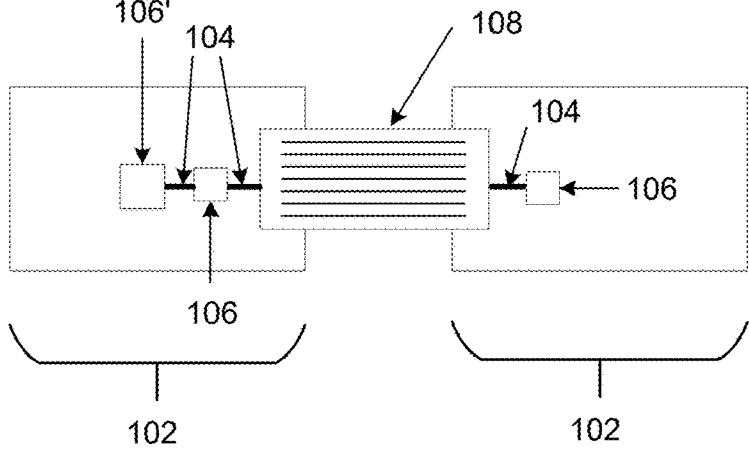
FIG. 7A shows at a top view of an electronic structure.
Figure 7B:
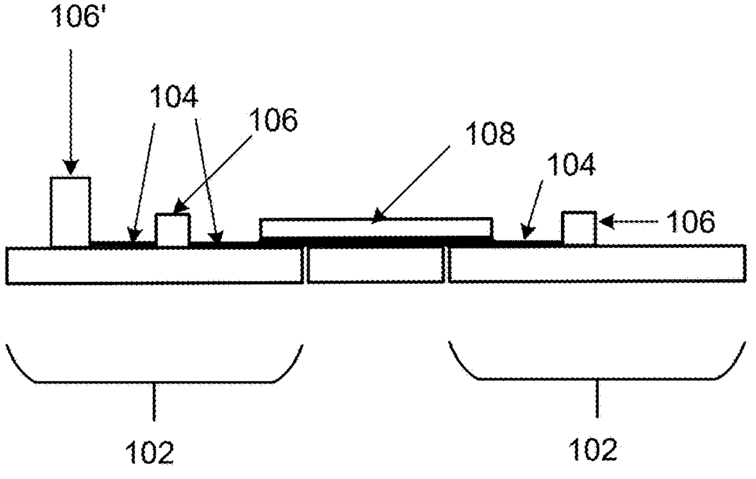
FIG. 7B shows a side view of an electronic structure.

FIG. 7A shows a top view of an electronic structure and FIG. 7B shows a side view of an electronic structure. The coupling element 108 may be provided e.g. as a flexible PCB comprising for instance printed conductors or an elastomeric connector with printed conductors. Electrical connections between the coupling elements(s) 108 and the subassemblies 102 can be implemented in multiple ways, such as conductive and/or structural adhesives, anisotropic conductive films (ACFs) and anisotropic conductive adhesives (ACAs), crimping, soldering and/or thermal fusing or any combination thereof. The subassemblies 102 of FIG. 6 could comprise features as described elsewhere herein, including circuit design 104 and any number of functional elements 106, 106' and possible dedicated molded plastic layer 204.

The coupling element 108 of embodiments corresponding to that of FIGS. 7A and 7B may be easy to manufacture in mass quantities, while bonding methods may be ones that are standard for use in other manufacturing stages of the electronic structure. The coupling element 108 of FIGS. 7A and 7B could be laminated for mechanical stability.

Figure 8:
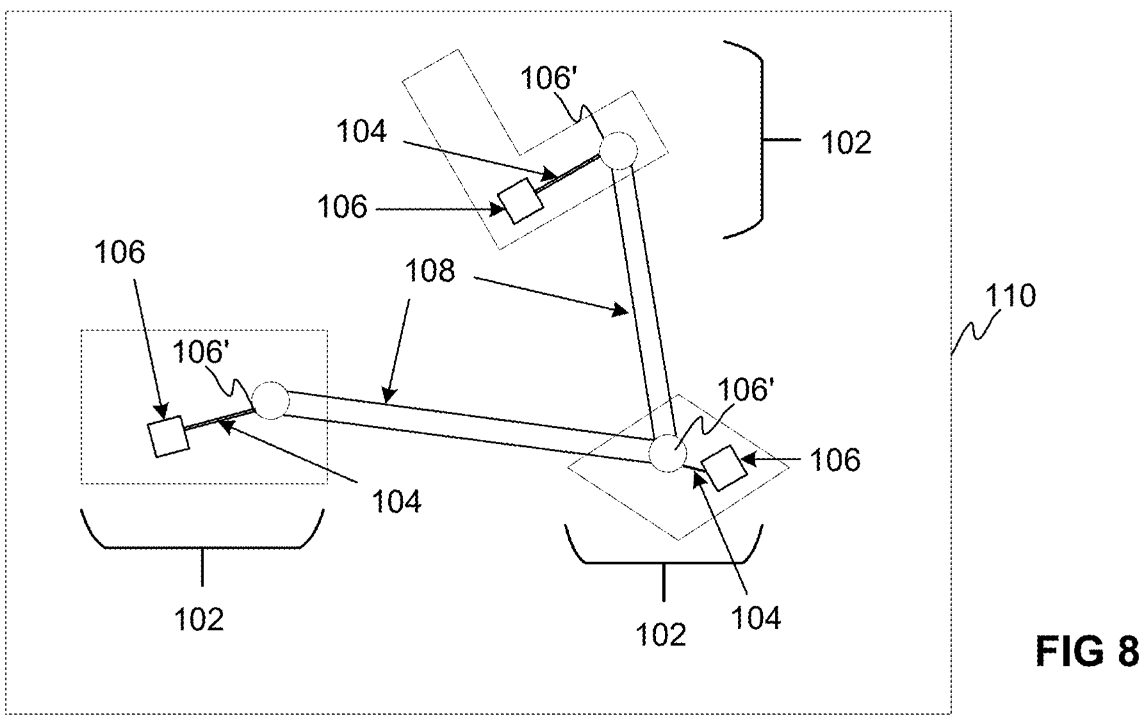
FIG. 8 shows a top view of an electronic structure.

FIG. 8 illustrates a top view of an electronic structure. Coupling elements 108 may constitute a wire harness-type solution. The coupling elements 108 may be thin, flexible cables printed with a solderable conductor and masked from areas that do not need to be soldered.

The subassemblies 102 may comprise connector elements 106' which are connected through the coupling elements 108.

The molded plastic layer 110 may provide a superstructure that hosts the subassemblies 102 and the coupling elements 108.

Even in cases where transmission of data is carried out via the coupling elements 108, the coupling elements 108 can comprise a shape that acts as an assembly guide: due to low cost and the possibility to co-design the "internal wire harness" provided through the coupling elements 108 for most efficient manufacturing, even sections of wire harness that do not have any conductivity can be utilized for guiding the location of connectors instead of making many smaller, shorter sections of cable that can get mixed up during assembly.

Figure 9:
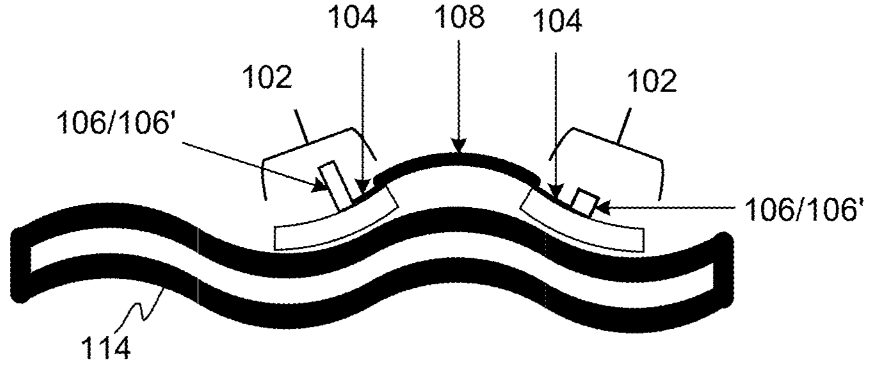
FIG. 9 illustrates a cross-sectional view of an electronic structure.

FIG. 9 illustrates a side view of an electronic structure. FIG. 9 shows a structure where a host substrate 114 may be formed into a three-dimensional shape, where the shape or forming parameters for forming the host substrate 114 are such that subassemblies 102 could not be placed at certain locations or where the subassemblies 102 cannot withstand the forming parameters that are used for forming the host substrate 114. The host substrate 114 may have e.g. embedded or printed wiring assembly, of which coupling elements 108 could be a part of.

The host substrate 114 may comprise highly formable material. In one example, the host substrate 114 may be a hot-formed glass sheet with sintering, provided with highly conductive printed traces. The subassemblies 102 may be provided to the electronic structure before forming of the host substrate 114, in which case the subassemblies 102 may bend rather than form with the host substrate 114. Subassemblies 102 may additionally or alternatively be provided onto an already formed host substrate 114.

Figure 10:
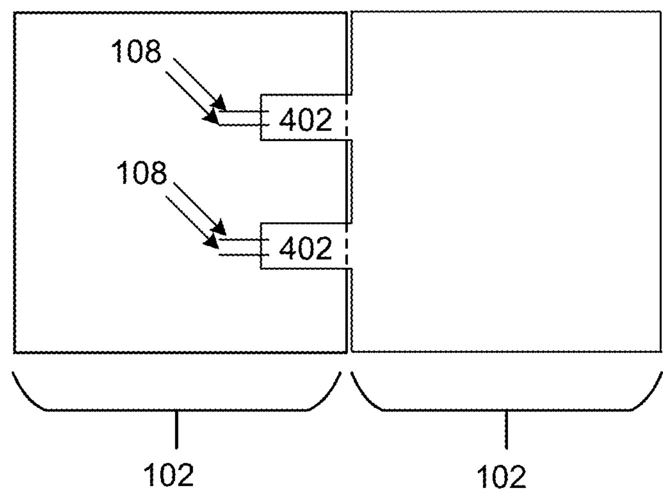
FIG. 10 shows a top view of an electronic structure.

FIG. 10 shows a top view of one embodiment of an electronic structure. Here, at least a portion of the subassemblies 102 may comprise flap elements 402 that are configured to overlap with one or more other subassemblies 102. The elements of subassemblies 102 shown in the figure and comprising the flap elements 402 may be substrates 202 of the subassemblies 102, thus constituting structures analogous to coupling elements 108, providing signal and power connectivity between subassemblies. Thus coupling element 108 could in one example be established e.g. through providing a suitably shaped subassembly 102, such as one comprising flap elements 402 as described above, together with adhesive.

The subassemblies 102 of FIGS. 4-10 are depicted schematically and show e.g. an outline of an exemplary shape of the subassemblies 102. The subassemblies 102 corresponding to the embodiment of FIGS. 4-10 may comprise constituents or other features as described elsewhere herein.

Figure 11:
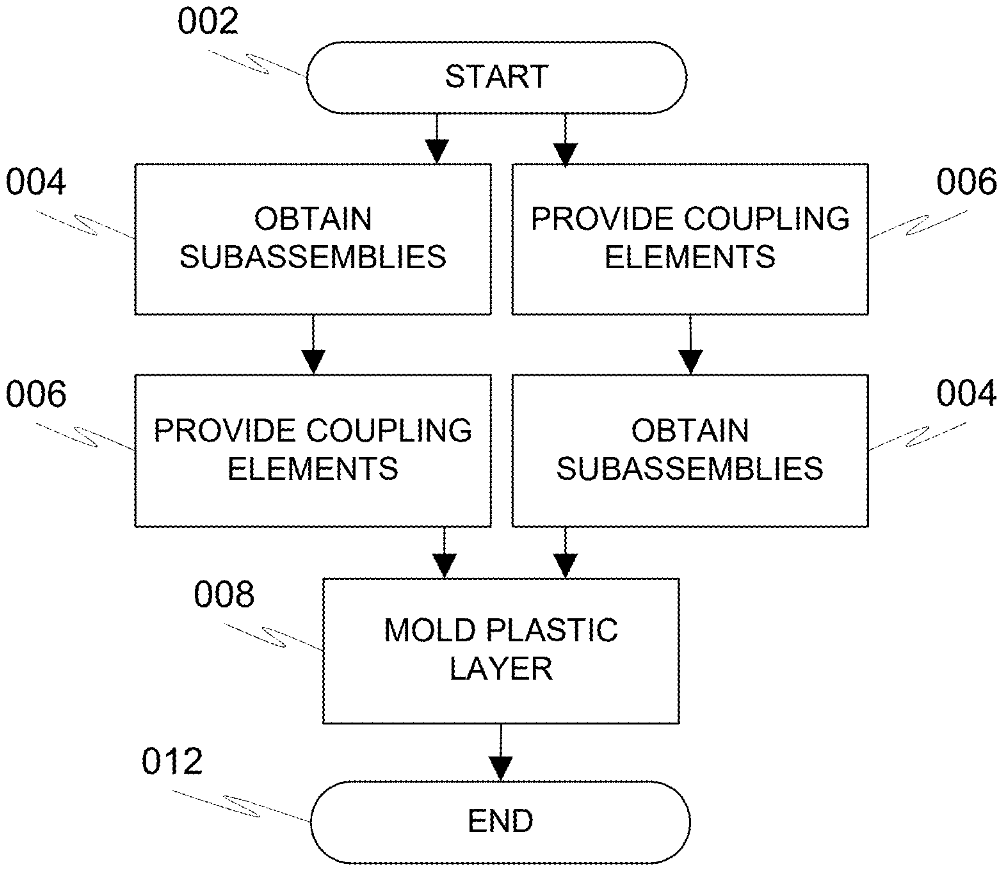
FIG. 11 shows a flow chart of a method according to one embodiment of the invention.

FIG. 11 shows a flow chart of a method for manufacturing an electronic structure.

The method may comprise a start phase 002, during which tasks such as material, component and tools selection, acquisition, calibration and other configuration tasks may take place. It may be ensured, for instance, that individual elements and material selections work together and survive the selected manufacturing and installation process. Selections may be checked e.g. on the basis of the manufacturing process specifications and component data sheets, or by investigating and testing the produced prototypes. The equipment applicable in each use case, such as molding/IMD (in-mold decoration), lamination, bonding, forming (pressure, vacuum, mechanical force, elevated temperature, or alike, or any combination thereof), electronics assembly, cutting, drilling and/or printing equipment, among others, may be thus ramped up to operational status at this stage. The start phase 002 may also involve configuring of a suitable mold tool.

The method comprises obtaining 004 a plurality of subassemblies 102, wherein each subassembly 102 is provided with a circuit design 104 and comprises or is configured to host at least one electrically functional element 106, wherein in at least one of the subassemblies at least one of the functional elements of the structure is a connector element 106'.

The subassemblies 102 may be obtained 004 as at least partially ready-made subassemblies 102 or the obtaining 004 of the subassemblies 102 may comprise at least partial manufacturing of the subassemblies 102. Thus, the subassemblies may be obtained as already comprising circuit design 104, functional element(s) 106, 106', possibly also dedicated molded plastic layer 204 or the method may comprise manufacturing of the subassemblies 102 through provision of e.g. circuit design 104, functional element(s) 106, 106' and dedicated molded plastic layer 204.

The obtaining 004 of the subassemblies 102 may comprise providing the subassemblies 102 as comprising a substrate film 202 onto which the at least one functional element 106 is provided. The circuit design 104 may be provided at least partially through printing technologies.

The subassemblies 102 may be provided to further comprise a plastic layer molded to at least partly embed the at least one functional element. The subassemblies with substrate film and functional element may preferably each be overmolded with plastic material to obtain a dedicated molded plastic layer 204 for the subassemblies 102 before further assembly of the electronic structure. Obtaining 004 of the subassemblies 102 could comprise forming of substrate films 202 of subassemblies 102 either before or after provision of the circuit design 104 and functional elements 106.

The method comprises providing 006 a plurality of coupling elements 108 to mechanically and electrically couple each subassembly 102 to at least one other subassembly 102. The subassemblies 102 and coupling elements 108 are modular entities joined together to establish the electronic structure, i.e. are not a monolithic body.

The steps of obtaining 004 the subassemblies 102 and providing 006 a plurality of coupling elements 108 may also be carried out in different order.

The method further comprises molding 008 a plastic material layer 110 onto at least a portion of the electronic structure to at least partially embed, surround, or host coupling elements 108, preferably each coupling element, the molded plastic layer 110 further being provided to at least partially embed, surround, or host subassemblies 102, preferably each subassembly. Further molded plastic layer(s) 112 may be provided At 012, method execution is ended. The method could comprise any further post-processing steps such as cutting or providing the electronic structure as part of a host structure, for example.

In some embodiments, the method may comprise providing the subassemblies 102 and coupling elements 108 on a host substrate 114, the method optionally comprising forming the host substrate 114. Providing of the subassemblies 102 and coupling elements 108 on a host substrate 114 may be carried out before molding 008 of the plastic layer 110.

The method may comprise providing the coupling elements 108 e.g. by printing conductive material, optionally by printing conductive material onto a flexible printed circuit board or elastomeric connector, or by printing conductive material onto a host substrate 114 accommodating the subassemblies 102 and coupling elements 108.

In some embodiments, the method may comprise providing a mold tool (to be utilized in an injection molding process for providing at least the molded plastic layer 110) comprising a main body and a plurality of alignment components, said alignment components and/or main body comprising attachment features for releasably attaching the alignment components to the main body at selected locations.

The method may then further comprise providing selected locations of the electronic structure upon the alignment components before molding, preferably providing at least some of the subassemblies onto alignment components, and placing the electronic structure in the vicinity of the main body of the mold tool, and allowing the attachment features to attach the alignment components to the main body, thereby aligning the selected locations of the electronic structure with selected locations of the mold tool.

A mold tool with the alignment components being used as inserts may enable reusing the alignment components several times. Replacement of alignment components may also be much cheaper than replacement of an entire mold tool.

For instance, simple linear strips of conductor may be used as coupling elements 108 for power and data transfer between subassemblies 102, which may enable low-cost manufacturing through e.g. mechanical patterning of metal-plastic film laminates.

Considering electronic structures employable in connection with e.g. drones, prior art solutions involving direct insert molding may be impossible, while the present invention enables accurate positioning of coupling elements 108 and subassemblies 102 outside of the main body of the mold tool, facilitating assembly, and yet enabling direct insert molding of the entire electronic structure.

A mold tool may be designed such that the main body of the mold tool has areas that are shaped, e.g. cut out, at selected locations, the locations corresponding to locations where the alignment components are to be releasably coupled to, to provide recesses in the mold tool at the selected locations. The selected locations may correspond to selected locations on the electronic structure.

The recess areas, or cut out portions, may e.g. comprise thickness of 2-3 mm or 1-2 mm, for example. Enough draft angle may be provided for the alignment components to have some self-alignment functionality.

Attachment features, such as magnets, may be provided into the recess areas of the main body of the mold tool.

Strength and number of retainment features may be adjustable and may be adjusted depending on the need of the use case. In some cases more accurate placement between the subassembly 102 and main body of the mold tool may be required, while for other cases, positioning requirements may be more relaxed.

Alignment components may be designed to essentially correspond to cut out areas of the main body of the mold tool or to complement the recess areas of the main body of the mold tool. The alignment components may comprise magnetic material or electromagnetic elements.

The alignment components may also comprise retention features, such as pins, for attaching the alignment components to the electronic structure or for retaining a substrate film 202 of a subassembly 102, and/or further retention features for e.g. connector blades.

The mold tool may be designed such that the alignment components are dispersed to essentially cover the entire area of the electronic structure, which may reduce risk of breakage of provided conductors at an edge of the alignment components.

Alternatively, the alignment components may be provided at areas corresponding to the electronic structure where e.g. wires or flat cable are provided as coupling elements 108, such that when the alignment components are aligned with the corresponding recesses in the main body of the mold tool, e.g the wires or flat cables are pulled taut, which may prevent or reduce their movement during molding.

A portion of at least some of the subassemblies 102 may be placed onto the alignment components, e.g. utilizing retention features. The coupling elements 108 may have been provided to couple the subassemblies to each other prior to this step.

It may be noted that the alignment components may increase thermal resistance between a substrate film 202 of subassemblies 102 and flow channels of the mold tool, which may be taken into account in material selections.

The alignment components and partially assembled electronic structure may then be aligned with the main body of the mold tool, for example by using an electromagnetic or pneumatic grabber. Attachment features such as magnets and a wiggling motion of a grabber may aid to snap the alignment components into place.

The molded plastic layer 110 may then be molded.

The subassemblies 102 may thus be seamlessly integrated into a much larger electronic structure, where positions are retained through the provided mold tool with main body and alignment components. A tolerance chain may be dramatically shortened.

The molding step may also form connector bodies, which may have the connector blades or pins pre-assembled on the subassemblies 102 as electrical connection elements. Even water-proof connector elements 106' may be made.

After molding, the finished electronic structure may be allowed to cool in the mold tool to a suitable temperature. The electronic structure may then be removed from the mold tool and the alignment components may be removed from the main body of the mold tool, whereafter they may be reused.

The scope of the present invention is determined by the attached claims together with the equivalents thereof. A person skilled in the art will appreciate the fact that the disclosed embodiments were constructed for illustrative purposes only, and other arrangements applying many of the above principles could be readily prepared to best suit each potential use scenario.

The invention claimed is:

1. An electronic structure comprising a plurality of subassemblies, wherein each subassembly comprises a circuit design and comprises or is configured to host at least one electrically functional element, wherein in at least one of the subassemblies at least one of the functional elements of the structure is a connector element, each subassembly being mechanically and electrically coupled to at least one other subassembly via at least one coupling element, wherein the subassemblies and coupling elements are modular entities joined together to establish the electronic structure, further wherein at least a portion of the electronic structure comprises at least one molded plastic layer, said molded plastic layer being provided to at least partially embed, surround, or host the coupling elements, the molded plastic layer further being provided to at least partially embed, surround, or host the subassemblies.

2. The electronic structure of claim 1, wherein the molded plastic layer is a continuous layer.

3. The electronic structure of claim 1, wherein the molded plastic layer is a discontinuous layer comprising regions of discontinuity between subassemblies.

4. The electronic structure of claim 1, wherein the structure comprises a further molded plastic layer or layers.

5. The electronic structure of claim 1, wherein the electronic structure further comprises a host substrate accommodating the subassemblies and the coupling elements, said host substrate comprising at least one material selected from the group consisting of polymer, thermoplastic material, electrically insulating material, Polymethyl methacrylate (PMMA), Poly Carbonate (PC), copolyester, copolyester resin, polyimide, a copolymer of Methyl Methacrylate and Styrene (MS resin), glass, Polyethylene Terephthalate (PET), carbon fiber, organic material, biomaterial, leather, wood, textile, fabric, metal, organic natural material, solid wood, veneer, plywood, bark, tree bark, birch bark, cork, natural leather, natural textile or fabric material, naturally grown material, cotton, wool, linen, silk, and any combination of the above.

6. The electronic structure of claim 5, wherein the host substrate is formed, through high pressure forming.

7. The electronic structure of claim 1, wherein at least a portion of the subassemblies each comprise a substrate, accommodating the functional element, wherein the substrate is formed, through high pressure forming.

8. The electronic structure of claim 1, wherein the coupling elements comprise metal or metal particle conductors.

9. The electronic structure of claim 1, wherein the molded plastic layer comprises thermoplastic material.

10. The electronic structure of claim 1, wherein the coupling elements are discrete elements, provided as physically separate entities from the subassemblies.

11. The electronic structure of claim 1, wherein the coupling elements comprise material that is different from a material of the subassemblies to which the coupling elements are coupled.

12. The electronic structure of claim 1, wherein the coupling elements comprise at least one of: conductive wiring, a flexible printed circuit carrier, an elastomeric printed circuit carrier, a printed conductor, conductive adhesive, or adhesive metal foil.

13. The electronic structure of claim 1, wherein a largest dimension of the electronic structure is over 30 cm.

14. A method of manufacturing an electronic structure, the method comprising:

obtaining a plurality of subassemblies, wherein each subassembly is provided with a circuit design and comprises or is configured to host at least one electrically functional element, wherein in at least one of the subassemblies at least one of the functional elements of the structure is a connector element, providing a plurality of coupling elements to mechanically and electrically couple each subassembly to at least one other subassembly, wherein the subassemblies and coupling elements are modular entities joined together to establish the electronic structure, and molding a plastic material layer onto at least a portion of the electronic structure to at least partially embed, surround, or host coupling elements, the molded plastic layer further being provided to at least partially embed, surround, or host subassemblies.

15. The method of claim 14, wherein the method further comprises providing the plurality of subassemblies with a substrate film onto which the at least one electrically functional element is provided.

16. The method of claim 14, further comprising providing the plurality of subassemblies and the plurality of coupling elements on a host substrate.

17. The method of claim 14, further comprising providing the plurality of coupling elements by printing conductive material.

18. The method of claim 14, wherein the method further comprises:

providing a mold tool comprising a main body and a plurality of alignment components, said plurality of alignment components and/or the main body comprising attachment features for releasably attaching the alignment components to the main body at selected locations, and providing selected locations of the electronic structure upon the alignment components before molding, and providing at least some of the subassemblies onto the plurality of alignment components, placing the electronic structure in the main body of the mold tool, and allowing the attachment features to attach the alignment components to the main body, thereby aligning the selected locations of the electronic structure with selected locations of the mold tool.

19. The method of claim 18, wherein the attachment features comprise magnets, and wherein the alignment components comprise magnetic material or electromagnetic elements.

20. The method of claim 18, wherein the alignment components comprise retention features for attaching the alignment components to the electronic structure.

* * * * *